United States Patent [19]

Peterson

[11] Patent Number: 4,572,772

[45] Date of Patent: Feb. 25, 1986

[54] METHOD FOR CLEANING AN ELECTRODE

[75] Inventor: James R. Peterson, Garland, Tex.

[73] Assignee: Texas Instruments Incorporated, Dallas, Tex.

[21] Appl. No.: 549,137

[22] Filed: Nov. 7, 1983

[51] Int. Cl.$^4$ ............................ C25F 1/00; C25F 7/00; C23C 14/00; B23K 11/16

[52] U.S. Cl. .................................. 204/141.5; 204/164; 204/192 E; 204/224 M; 204/225; 204/277; 219/56.22

[58] Field of Search ............. 204/129.1, 129.43, 129.5, 204/129.55, DIG. 6, DIG. 12, 141.5, 144.5, 146, 192 E, 164, 224 M, 225; 313/619; 219/56.21, 56.22, 130.51

[56] References Cited

U.S. PATENT DOCUMENTS

| | | | |
|---|---|---|---|
| 1,918,159 | 7/1933 | Weisberg et al. | 204/32.1 |
| 2,456,281 | 12/1948 | Hyner | 204/141 |
| 2,722,511 | 11/1955 | Butler et al. | 204/130 |
| 3,068,352 | 12/1962 | Correy | 219/130.51 X |
| 3,378,668 | 4/1968 | Dolomont | 204/141.5 |
| 3,598,954 | 8/1971 | Iceland et al. | 219/130.51 X |
| 3,654,108 | 4/1972 | Smith, Jr. | 204/164 |
| 3,900,376 | 8/1975 | Copsey et al. | 204/141.5 |
| 4,387,283 | 6/1983 | Peterson et al. | 219/56.21 |
| 4,388,512 | 6/1983 | Salzer et al. | 219/56.22 |

Primary Examiner—Donald R. Valentine
Attorney, Agent, or Firm—Richard A. Bachand; N. Rhys Merrett; Melvin Sharp

[57] ABSTRACT

An electronic flame off (EFO) electrode used to form balls on bonding wire builds up layers of aluminum oxide during use. The aluminum oxide is removed by moving the EFO electrode next to a cleaning electrode, and causing a glow discharge to pass across the gap between them. The EFO electrode is charged negative with respect to the cleaning electrode, and a noble gas, such as argon, fills the region around the gap.

5 Claims, 2 Drawing Figures

METHOD FOR CLEANING AN ELECTRODE

BACKGROUND AND SUMMARY OF THE INVENTION

The present invention relates generally to the cleaning of electrodes and more specifically to a method for cleaning electrodes used in electronic flame off methods of bonding ball formation.

Formation of bonding balls on bonding wire is commonly done with the electronic flame off (EFO) technique. This involves moving an electrode near the tip of the bonding wire, and causing an electric arc to pass across the gap between them. This arc melts the tip of the bonding wire, causing a ball to form thereon.

Until very recently, this technique has proved successful only with gold bonding wire. It would be very desirable to use aluminum bonding wire instead of gold because of its lower cost and greater availability. However, the art has only recently advanced to the point where aluminum ball bonding is a feasible industrial process.

Feasible methods for aluminum ball bonding using the electronic flame off technique have been described in U.S. Pat. No. 4,387,283, APPARATUS AND METHOD OF FORMING ALUMINUM BALLS FOR BALL BONDING, issued to Peterson et al., on June 7, 1983, and in a pending U.S. patent application SELF STARTING CURRENT CONTROL DISCHARGE BONDING WIRE MAKER, Ser. No. 248,775, filed Mar. 30, 1981, now abandoned, by James L. Landes, and assigned to the assignee of the present application, both of which references are herein incorporated by reference. These references show a method for forming an aluminum bonding ball by electronic discharge, and surrounding the arc region with argon gas.

A certain amount of aluminum oxide forms on the EFO electrode each time a bonding ball is formed. Due to electrode contamination, the quality of the bonding balls thus formed gradually degrades. Degradation occurs because aluminum oxide is an insulator and interferes with the normal functioning of the electrode tip.

Mechanical scraping of the electrode tip is one possible method of removing the aluminum oxide which has been deposited. However, this method has serious drawbacks in that continual mechanical adjustments would be required to avoid excessive damages to electrode tip. Additionally, the mechanical apparatus needed to scrape the electrode tip would need to be located in the automated ball bonding machinery near the EFO electrode's normal operating position, a location where space is already at a premium.

It would therefore be desirable to provide a method for removing contaminants from the tip of the EFO electrode. It would be desirable that such a method be simple, cheap, and easy to use. It would further be desirable that such a cleaning method cause a minimum amount of damage to the electrode tip, thus extending its life. It would be further desirable that the cleaning method be compatible with the use of automated ball bonding machinery, and be small in order to converse space within the automated ball bonding machinery. The cleaning method should also operate without increasing the cycle time of the bonding machinery.

It is therefore an object of the present invention to provide a method for cleaning an EFO electrode which includes all of the above desirable qualities.

In accordance with the present invention, a cleaning electrode is provided at a position slightly removed from the normal operating position of the EFO electrode. The EFO electrode is periodically removed from its normal operating position to a position adjacent to cleaning electrode. An electric discharge is caused to flow across the gap between the cleaning and EFO electrodes, with the EFO electrode biased negative with respect to the cleaning electrode. The region near the gap between electrodes is filled with a noble gas, preferably argon. The gas is ionized and impacts on the EFO electrode with sufficient energy to remove the thin aluminum oxide layers which have formed thereon.

The novel features which characterize the present invention are defined by the appended claims. The foregoing and other objects and advantages of the present invention will hereinafter appear, and for purposes of illustration, but not of limitation, two preferred embodiments are shown in the drawings.

DESCRIPTION OF THE PREFERRED EMBODIMENTS

Figure 1:
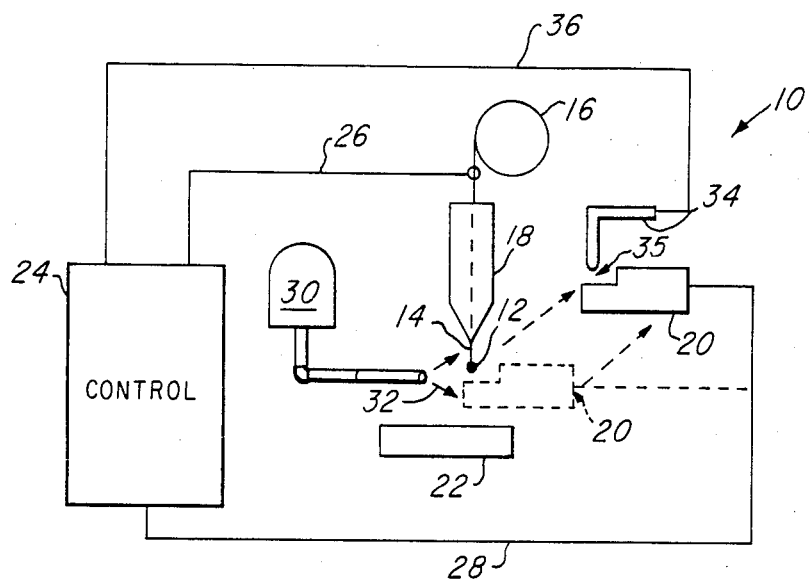
FIG. 1 is a functional block diagram illustrating the method of the present invention.

Referring to FIG. 1, an apparatus 10 for forming bonding balls 12 on the tip of a bonding wire 14 is shown. Small diameter bonding wire 14, for example one mil wire, is stored on a spool 16 and taken therefrom as needed and fed through a bonding tip, or capillary 18. Bonding balls 12 are formed on the wire 14 where it projects beyond the bonding tip 18. Bonding balls 12 are formed by generating an electric arc between the tip of the bonding wire 14 and and electronic flame off (EFO) electrode 20 as known in the art. For example, the ball forming arc can be initiated at 600 volts and approximately 1 amp, with the arc continuing at approximately 50 volts and 2 amps for a duration sufficient to generate a bonding ball 12 of the desired size.

A gas supply 30 supplies argon gas (shown by arrows 32) to the region of the ball forming arc. This tends to remove most of the oxygen in the region, slowing the rate of aluminum oxide formation on the bonding ball 12 and giving better shaped bonding balls. Thin layers of aluminum oxide will build up on the EFO electrode 20 each time a bonding ball 12 is formed. After a period of time, the aluminum oxide, which is an insulator, will interfere with proper operation of the EFO electrode 20 and cause a degradation in the quality of the bonding balls which are formed.

In order to prevent degradation of the quality of bonding balls 12 formed, the present invention provides for periodically removing the aluminum oxide which builds up on the EFO electrode 20. This is accomplished by mechanically moving the EFO electrode 20 to a position adjacent a cleaning electrode 34 as shown by the solid lines FIG. 1. A voltage is generated across the gap 35 between the cleaning and EFO electrodes 34, 20, with the cleaning electrode 34 being made positive through line 36 and the EFO electrode 20 being made negative through line 28. The voltage is preferably such that a glow discharge, as opposed to an arc discharge, is created across this gap 35.

The cleaning electrode 34 is located near enough to the normal operating position of the EFO electrode 20 that the argon gas 32 also fills the region around the cleaning electrode 34. When the glow discharge is initiated between cleaning and EFO electrodes 34, 20, the argon gas 32 is ionized and accelerated toward the EFO electrode 20. The impact of this ionized argon hitting the EFO electrode 20 strips away the thin layers of aluminum oxide which have formed thereon. After the cleaning operation, the EFO electrode can be moved back to its normal operating position (as shown by the dashed lines in FIG. 1) and used in the normal manner.

It is not generally necessary to clean the EFO electrode 20 after each bonding ball 12 has been formed. The aluminum oxide layer formed on the EFO electrode 20 is usually only a few molecules thick for each bonding ball 12 formed. It is preferred to clean the EFO electrode 20 only periodically, for example, after every 24 bonding ball formation steps. When the automatic ball bonding machinery 10 is bonding a 24 pin integrated circuit 22, the EFO electrode 20 can be cleaned while a new integrated circuit 22 is being positioned. The number of ball formation steps between cleaning steps can be adjusted to match the number of pins on the integrated circuit 22 being bonded. Cleaning the EFO electrode 20 less often will also give extended electrode life. A thin layer of the electrode 20 will be stripped away with each cleaning operation, and the replacement rate of the electrode 20 will be proportional to the cleaning frequency.

It is preferable that the electric discharge between the cleaning electrode 34 and the EFO electrode 20 be of the glow discharge type. This type of discharge, as opposed to an arc discharge, covers a greater area and cleans more of the EFO electrode 20 surface. A glow discharge can be formed by using, for example, a 10-20 kilovolt arc at 1 milliamp or less. An arc discharge could also be used, but would typically clean a smaller area of the EFO electrode 20. This would leave some aluminum oxide on the EFO electrode 20, causing imperfect bonding ball formation. The positioning of the EFO electrode with respect to the cleaning electrode 34 is not extremely critical. A gap of 20 or 30 thousandths of an inch is easily obtainable mechanically, and provides satisfactory cleaning action.

It is preferable that argon gas be used to fill the region between the cleaning and EFO electrodes 34, 20 during the cleaning operation. It is not absolutely necessary, because most gases will ionize and clean the EFO electrode by the force of ionic bombardment. Argon, however, is a noble gas, and will not react with the metal of the electrode 20. Additionally, it is fairly heavy, and is therefore gives better results than neon or helium. Also, heavier noble gases such as radon are radioactive and are not suitable for use in an environment of integrated circuit production. Additionally, argon gas is relatively inexpensive, thus adding little to the cost of bonding the operation.

Figure 2:
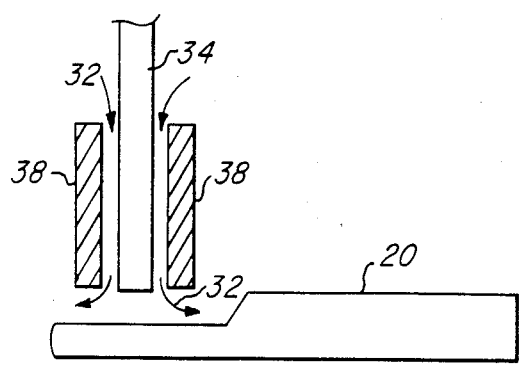
FIG. 2 is a diagramatic elevation illustrating an alternative embodiment of the invention.

An alternative embodiment of the present invention is shown in FIG. 2. If too much ambient oxygen is present in the region between the cleaning electrode 34 and the EFO electrode 20, a collar 38 may be used in conjunction with the cleaning electrode. Argon gas is funneled aroung the cleaning electrode through the collar, and into the space between the electrodes. This insures a higher concentration of argon gas and excludes oxygen from the glow discharge region.

Although preferred embodiments have been described in detail, it should be understood that various additions and modifications can be made to the present invention without departing from the scope thereof. The preferred embodiments are intended only to illustrate the principles of the invention, the scope of which is defined by the appended claims.

What is claimed is:

1. A device for cleaning a contaminated wire dispensing electrode, comprising:
   a work area at which wires dispensed by said wire dispensing electrodes are attached to a work piece;
   a cleaning electrode located away from said work area means for periodically positioning the wire dispensing electrode adjacent said cleaning electrode;
   means for introducing a noble gas into the region between the wire dispensing electrode and the cleaning electrode;
   means for forming a glow discharge between said cleaning electrode and the wire dispensing electrode,
   and means for biasing the cleaning electrode negatively relative to said wire dispensing electrode.

2. A method for cleaning aluminum oxide from a wire dispensing electrode, comprising the steps of:
   (a) moving the wire dispensing electrode away from a workpiece, and positioning the electrode adjacent to a cleaning electrode;
   (b) introducing a noble gas into the region between the wire dispensing electrode and the cleaning electrode; and
   (c) negatively biasing the wire dispensing electrode relative to the cleaning electrode, and causing a glow discharge between the wire dispensing electrode and the cleaning electrode.

3. The method of claim 2, wherein the noble gas is argon.

4. The method of claim 2, wherein the noble gas passes through a collar around the cleaning electrode.

5. A method for cleaning aluminum oxide from ball bonding electrode, comprising the steps of:
   (a) removing the bonding electrode to a position adjacent a cleaning electrode remote from a ball bonding work area after a preselected number of bonding balls have been formed;
   (b) filling the region between the bonding electrode and the cleaning electrode with a noble gas; and
   (c) negatively biasing the ball bonding electrode, and causing a glow discharge between the bonding electrode and the cleaning electrode.

* * * * *